United States Patent [19]

Endoh

[11] Patent Number: 5,895,949

[45] Date of Patent: Apr. 20, 1999

[54] SEMICONDUCTOR DEVICE HAVING INVERSION INDUCING GATE

[75] Inventor: Tetsuo Endoh, Yokohama, Japan

[73] Assignee: Kabushiki Kaisha Toshiba, Kawasaki, Japan

[21] Appl. No.: 08/879,790

[22] Filed: Jun. 20, 1997

Related U.S. Application Data

[63] Continuation of application No. 08/642,206, May 6, 1996, Pat. No. 5,677,556, which is a continuation of application No. 08/266,466, Jun. 27, 1994, abandoned.

[30] Foreign Application Priority Data

Jun. 29, 1993 [JP] Japan .................... 5-158378

[51] Int. Cl.$^6$ ................................... H01L 29/76
[52] U.S. Cl. .................................... 257/314
[58] Field of Search ........................ 257/314–316

[56] References Cited

U.S. PATENT DOCUMENTS

5,278,439  1/1994  Ma et al. ................... 257/319
5,554,867  9/1996  Ajika et al. ................. 257/314

*Primary Examiner*—Olik Chaudhuri
*Assistant Examiner*—Howard Weiss
*Attorney, Agent, or Firm*—Oblon, Spivak, McClelland, Maier & Neustadt, P.C.

[57] ABSTRACT

A semiconductor device is characterized by comprising a semiconductor substrate, a first insulating film formed on the semiconductor substrate, a plurality of cell transistors each having a control gate formed on the semiconductor substrate through the first insulating film, a second insulating film formed on upper and side surfaces of the control gate, and a conductive film formed on at least the side surface of the control gate through the second insulating film.

25 Claims, 10 Drawing Sheets

SEMICONDUCTOR DEVICE HAVING INVERSION INDUCING GATE

This is a Continuation of application Ser. No. 08/642,206, filed on May 6, 1996, now U.S. Pat. No. 5,677,556, which is a Continuation of application Ser. No. 08/266,466, filed on Jun. 27, 1994, now abandoned.

BACKGROUND OF THE INVENTION

1. Field of the Invention

The present invention relates to a semiconductor device, especially, a semiconductor memory device including a MOS transistor and a semiconductor memory device having a new structure.

2. Description of the Related Art

As semiconductor memory devices, there are nonvolatile semiconductor memory devices (EEPROM), dynamic semiconductor memory devices (DRAM) and the like. An EEPROM will be described below.

A NAND cell type EEPROM which allows high integration is known as one of EEPROMs. In the NAND cell EEPROM, sources and drains of a plurality of memory cells are connected in series with each other to be commonly used by the adjacent memory cells, and connected to a bit line as one unit.

A memory cell generally has a MOSFET structure in which a charge storage layer (floating gate) and a control gate are stacked. A memory cell array is integrated in a p-type well formed on a p-type or n-type substrate. The drain side of the NAND cell is connected to the bit line through a selection gate. The source side of the NAND cell is connected to a source line (reference potential wire) through a selection gate. The control gates of the memory cells are continuously disposed in the row direction to serve as a word line.

The operation of the NAND cell type EEPROM is as follows.

The data write operation is sequentially performed from a memory cell at a position farthest from the bit line. A high voltage $V_{pp}$ (=about 20 V) is applied to the control gate of the selected memory cell. An intermediate potential $V_{PPM}$ (=about 10 V) is applied to the control gates and the selection gates of the memory cells on the bit line side. A voltage of 0 V or the intermediate potential is applied to the bit line in accordance with data. When a voltage of 0 V is applied to the bit line, the potential is transmitted to the drain of the selected memory cell to cause charge injection from the substrate side to the floating gate.

With the above operation, the threshold value of the selected memory cell is shifted in the positive direction. This state is defined as, e.g., "1". Application of the intermediate potential does not cause charge injection, so that the threshold value is kept unchanged at the negative value. This state is defined as "0".

The data erase operation is simultaneously performed for all the memory cells in the NAND cell. More specifically, all the control gates are set to 0 V, and a high voltage of 20 v is applied to the selection gates, the bit line, the source line, the p-type well and the n-type substrate on which the memory cell array is formed. With this operation, charges in the floating gates are released to the substrate side in all the memory cells, and the threshold value is shifted to the negative direction.

The data read operation is performed as follows. A power supply voltage $V_{CC}$ is applied to the bit line, and a voltage of 0 V is applied to the source line. The control gate of the selected memory cell is set to 0 V, and the potential of the control and selection gates of the remaining memory cells are set to the power supply potential (=5 V). It is detected whether or not a current flows in the selected memory cell, thereby performing the data read operation.

In the structure of the conventional NAND cell type EEPROM, all the memory cells constituting the NAND cell are connected with each other through a source-drain diffusion layer. For this reason, the diffusion layer inevitably extends under the gates, and the effective channel length is decreased. This poses a problem on size reduction of a memory cell. As the memory cell becomes finer, the coupling capacitance between the control gate and the floating gate is decreased, resulting in a decrease in coupling factor of the memory cells.

As described above, in the conventional NAND cell type EEPROM, the diffusion layer extends under the gates to cause a decrease in effective channel length or coupling factor of the memory cells.

The above problem, which is a decrease in effective channel length or coupling factor of the memory cells, is not limited to NAND cell type EEPROMs, and also applies to DRAMs, MOS transistor or the like.

SUMMARY OF THE INVENTION

It is an object of the present invention to provide a semiconductor device capable of preventing a decrease in effective channel length due to a diffusion layer extending under a gate.

It is another object of the present invention to provide a semiconductor memory device increasing the coupling factor of memory cells.

The gist of the present invention is that a conductive film is formed in a space between transistors or the memory cells, and a voltage is applied to this conductive film, thereby forming an inversion layer having the same function as that of the diffusion layer in the semiconductor substrate surface region.

A semiconductor device of the present invention comprises a semiconductor substrate; a first insulating film formed on the semiconductor substrate; a plurality of cell transistors each having a control gate formed on the semiconductor substrate through the first insulating film; a second insulating film formed on upper and side surfaces of the control gate; and a conductive film formed on at least the side surface of the control gate through the second insulating film.

The device further comprises voltage supplying means connected to the conductive film formed on the side surface of the control gate via the insulating film, wherein, when the voltage is applied from the voltage supplying means to the conductive film, an inversion layer is formed on a surface region of the substrate faced to the conductive film.

Each cell transistor providing memory cell includes a charge storage layer formed between the first insulating film and the control gate so that an electrical an amount of write operation can be performed by changing charges of the charge storage layer, and the conductive film is formed on a side surface of the charge storage layer.

More than one of the memory cells are connected in series with each other to constitute a NAND cell.

More than one of the memory cells are connected in parallel with each other to constitute one unit memory cell.

The memory cells are divided into a plurality of blocks and the conductive films are formed for each block, and further comprises means, in one of a data read mode, a data write mode and a data erase mode, for applying a second voltage to the conductive film in a selected block including a selected word line, when a first voltage is applied to the selected word line, and for applying a third voltage to the conductive film in a non-selected block.

In a data read mode, a potential of a selection gate and a drain of a NAND cell is set to a power supply potential, a potential of a word line selected from word lines comprising the control gates is set to "L" (0 volts), a potential of non-selected word lines is set to the power supply potential, a potential of a source of the NAND cell is set to "L" (0 volts), and a potential of the substrate is set to "L" (0 volts), thereby setting a potential of the conductive film to the power supply potential, in a data erase mode, the potential of the selection gate and the drain of the NAND cell is set to "H" (20 volts), the potential of all of the word lines in the NAND cell is set to "L" (0 volts), and the potential of the substrate is set to "H" (20 volts), thereby setting the potential of the conductive film to "L" (0 volts), or in a data write mode, the potential of the drain of the NAND cell is set to "L" (0 volts) or "M" (10 volts), the potential of the selected word line is set to "H" (20 volts), the potential of a drain-side selection gate and the non-selected word lines is set to "M" (20 volts), and the potential of a source-side selection gate and the substrate is set to "L" (0 volts), thereby setting the potential of the conductive film to "H" (20 volts).

The NAND cells are divided into blocks each having a plurality of NAND cells, and the conductive film is formed for the each block, in the data read mode, the potential of the conductive film in a selected block is set to the power supply potential, the potential of the conductive film in non-selected blocks is set to "L" (0 volts), in the data write mode, the potential of the conductive film in the selected block is set to "H", and the potential of the conductive film in the non-selected blocks is set to "L" (0 volts).

In above configuration, at least two the MOS transistor are connected in series.

A device further comprises a plurality of capacitors coupled to the cell transistors to constitute a plurality of memory cells, in conjunction with the cell transistor; and bit lines coupled to the cell transistors.

The bit line formed on the side surface of the conductive film via a third insulating film and connected to a region to which the inversion layer of the substrate is formed, and the capacitor selectively formed on the side surface of the conductive film via a third insulating film and connected to another region to which the inversion layer of the substrate is formed.

One of the electrodes constituting the capacitor is formed on the same plane of the control gate, one of the electrodes constituting the capacitor is formed over the conductive film via the third insulating film, or one of the electrodes constituting the capacitor is formed in a trench selectively formed on the substrate via a fourth insulating film.

The memory cells are divided into a plurality of blocks and the conductive films are formed for each block, and further comprises means, in one of a data read mode, a data write mode and a data erase mode, for applying a second voltage to the conductive film in a selected block including a selected word line, when a first voltage is applied to the selected word line, and for applying a third voltage to the conductive film in a non-selected block.

A semiconductor device comprises a semiconductor substrate; a first insulating film formed on the semiconductor substrate; a plurality of electrically erasable semiconductor memory cells each having a control gate formed on the semiconductor substrate through the first insulating film and a charge storage layer formed between the first insulating film and the control gate so that an electrical rewrite operation can be performed by changing an amount of charges of the charge storage layer, a selected number of the memory cells constituting an unit which are connected in series; a second insulating film formed on upper surface of the control gate and side surfaces of the control gate and the charge storage layer; and a conductive film formed on at least the side surface of the control gate and the charge storage layer through the second insulating film.

The device further comprises voltage supplying means connected to the conductive film formed on the side surface of the control gate via the insulating film, wherein, when the voltage is applied from the voltage supplying means to the conductive film, an inversion layer is formed on a surface region of the substrate faced to the conductive film.

According to the present invention, for example of a semiconductor memory device, in the data read or write modes (upon charge injection to the charge storage layer), a voltage is applied to the conductive film, thereby forming the inversion layer in the space between the memory cells in the semiconductor substrate surface region. The memory cells are connected to each other through this inversion layer. Therefore, a source-drain diffusion layer need not be formed for each memory cell, and a decrease in effective channel length due to the diffusion layer extending under the gates can be prevented.

In the write and erase modes, the potential of the conductive film is set to a second potential or a third potential. With this operation, the charge storage layer is coupled with not only the control gate but also the conductive film, so that the coupling factor of the memory cells can be increased. In addition, a decrease in effective channel length can be prevented, and an increase in coupling factor effectively acts upon size reduction of memory cells.

Additional objects and advantages of the present invention will be set forth in the description which follows, and in part will be obvious from the description, or may be learned by practice of the present invention. The objects and advantages of the present invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the present invention and, together with the general description given above and the detailed description of the preferred embodiments given below, serve to explain the principles of the present invention in which.

5

DETAILED DESCRIPTION OF THE PREFERRED EMBODIMENTS

The present invention will be described below in detail with reference to the accompanying drawings.

An embodiment in which the present invention is applied to a NAND type EEPROM will be described.

Figure 1:
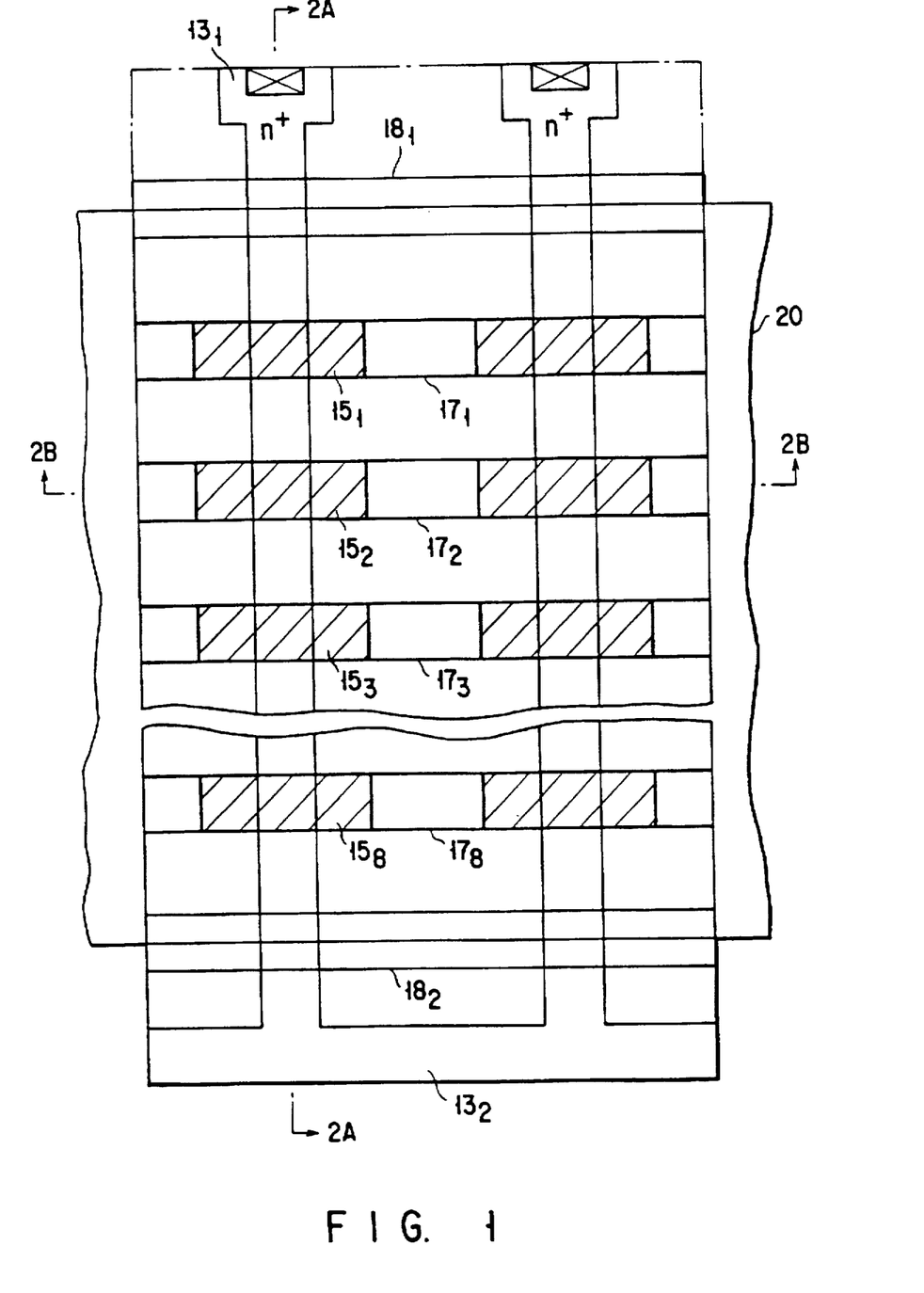
FIG. 1 is a plan view showing two NAND cell portions of an NAND cell type EEPROM according to the first embodiment of the present invention.
Figures 2A, 2B:
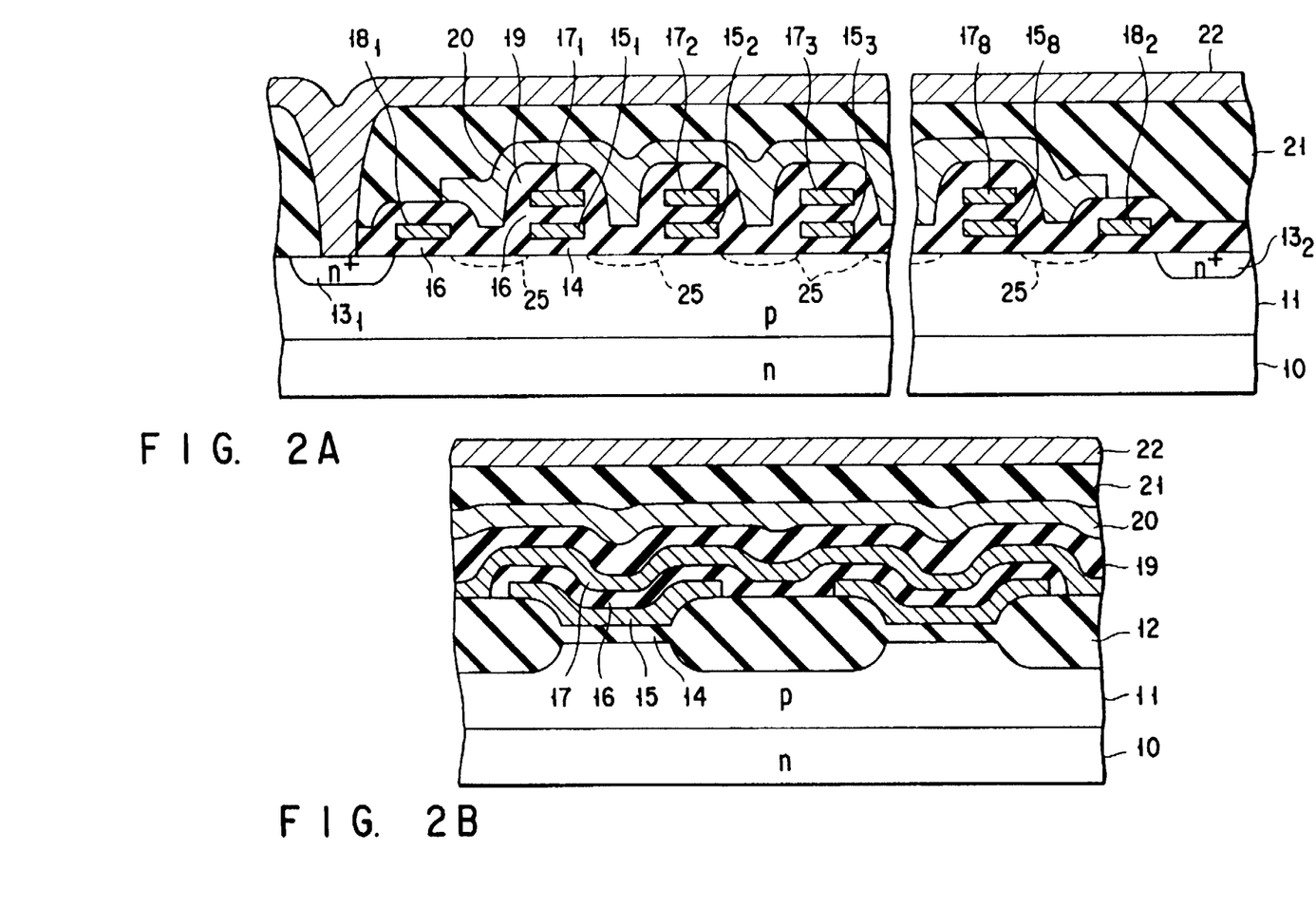
FIGS. 2A and 2B are sectional views taken along lines 2A—2A and 2B—2B in FIG. 1, respectively.
Figure 3:
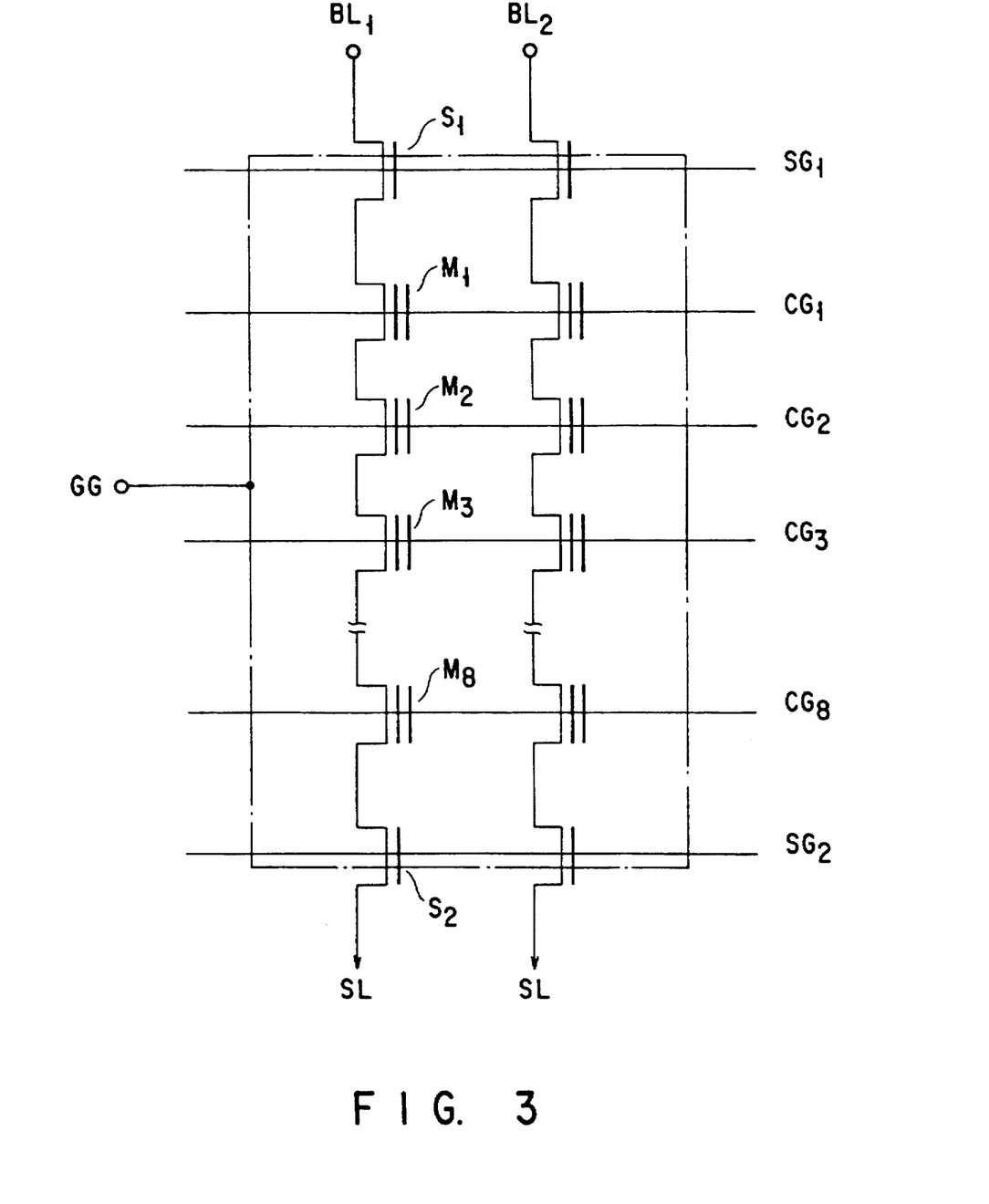
FIG. 3 is a circuit diagram showing an equivalent circuit of an element structure in FIG. 1.

FIG. 1 is a plan view showing two NAND cell portions of a NAND cell type EEPROM according to the first embodiment of the present invention. FIGS. 2A and 2B are sectional views taken along lines 2A—2A and 2B—2B in FIG. 1, respectively. FIG. 3 is a circuit diagram showing an equivalent circuit of the NAND cell.

A p-type well 11 is formed on an n-type Si substrate 10. In the well 11, a memory cell array constituted by a plurality of NAND cells is formed in an element formation region surrounded by an element isolation oxide film 12. The structure of one NAND cell will be described below.

In the first embodiment, eight memory cells $M_1$ to $M_8$ are connected in series with each other to constitute one NAND cell.

Each memory cell consisting of polysilicon formed on the well 11 through a tunnel oxide film 14 having a thickness of about 10 nm has a structure in which a floating gate 15 ($15_1$ to $15_8$) functioning as a charge storage layer, and a control gate 17 ($17_1$ to $17_8$) consisting of polysilicon is formed on the floating gate 15 through a gate insulating film 16 having a thickness of about 20 nm.

Selection gates 18 ($18_1$ and $18_2$) simultaneously formed with the control gate 17 of the memory cell are provided to the drain and source sides of the NAND cell. These selection gates 18 may have a two-layered structure as in the memory cell portion. An $n^+$-type diffusion layer $13_1$ is formed at the drain-side end portion of the NAND cell, and an $n^+$-type diffusion layer 132 is formed at the source-side end portion.

In the present invention, unlike the prior art, no source-drain diffusion layer is formed between the memory cells

6 constituting the NAND cell. Instead, in the first embodiment, an oxide film 19 is formed on the upper surface of the control gate 17 and on the side surfaces of the control and floating gates 17 and 15, and a conductive film 20 consisting of polysilicon is formed on the oxide film 19. The conductive film may be called an inversion inducing gate (IG) or source/drain reactive gate in the embodiments of the present invention. The side oxide film of the control gates 17 and the floating gates 15 have U-shaped spaces and the conductive film 20 is formed to cover a plurality of NAND cells and fill up the U-shaped spaces. Upon application of a voltage to the conductive film 20, an inversion layer 25 shown in dot lines is formed in the substrate between the memory cells to connect the memory cells in series with each other.

In the present embodiment, to form the conductive film 20, widening the space between the memory cells is not necessary. As described above, it is an advantage of the present embodiment to be able to form the conductive film 20 without widening the area of the memory cells.

The conductive film 20 may be arranged not to be short-circuit with at least a bit line contact of the $n^+$-type diffusion layer 131 in the direction of 2A–2A' in FIG. 1. As shown in FIG. 1, the conductive film 20 is terminated on the drain-side selection gate. Referring to FIG. 2A, the conductive film 20 is terminated on the source-side selection gate. However, the conductive film 20 may be extended and coupled with the conductive film 20 of the next NAND cell with respect to the source. This state is shown in FIG. 4.

In addition, the conductive film 20 can have a structure of which the conductive film 20 is selectively formed on the side wall of the floating gate. In this case, the capacitance of the word line can decrease thereby more high speed operation can be attained.

Figure 4:
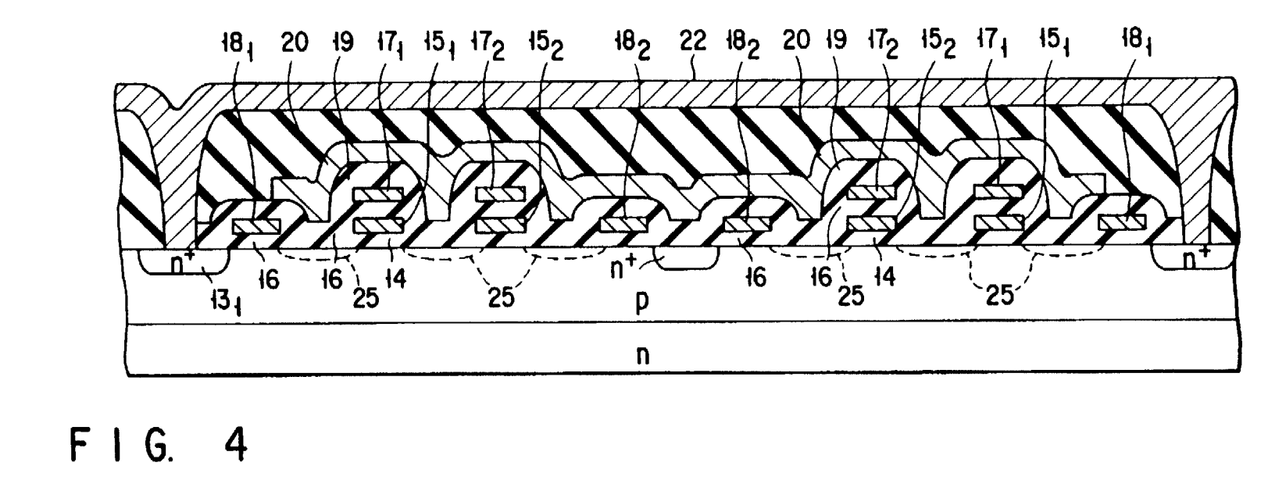
FIG. 4 is a sectional view showing a modification corresponding to the section taken along the line 2A—2A in FIG. 1.

FIG. 4 is a sectional view showing the structure wherein two cells are connected in series with each other.

A CVD oxide film 21 is formed on the substrate having elements thereon. A bit line 22 is formed on the CVD oxide film 21. The bit line 22 is in contact with the drain-side diffusion layer $13_1$ at one end of the NAND cell. The control gates 17 of the NAND cell, which s are aligned in the row direction, are also formed as control gate lines $CG_1$ to $CG_8$. These control gate lines serve as word lines. The selection gates $18_1$ and $18_2$ are also continuously formed as selection gate lines $SG_1$ and $SG_2$ in the row direction.

The operation of the first embodiment will be described with reference to an equivalent circuit in FIG. 3 and Table 1.

The basic operation is the same as in the conventional device. In the first embodiment, however, a voltage is applied to the conductive film 20 (IG; inversion gate) as follows. Table 1 shows an example in which the data read/write operation is performed with respect to the memory cell $M_3$ of the NAND cell coupled with the bit line 22 ($BL_1$).

TABLE 1

|  | Read | Write | Erase |
| --- | --- | --- | --- |
| $BL_1$ | 5 V | 0,10 V | 20 V |
| $SG_1$ | 5 V | 10 V | 20 V |
| $CG_1$ | 5 V | 10 V | 0 V |
| $CG_2$ | 5 V | 10 V | 0 V |
| $CG_3$ | 0 V | 20 V | 0 V |

TABLE 1-continued

|  | Read | Write | Erase |
|---|---|---|---|
| . | . | . | . |
| . | . | . | . |
| . | . | . | . |
| CG$_8$ | 5 V | 10 V | 0 V |
| SG$_2$ | 5 V | 0 V | 20 V |
| SL | 0 V | 0 V | 20 V |

In the data write operation, a voltage is applied as follows.

A high voltage vpp (=about 20 V) is applied to the control gate line CG$_3$ of the selected memory cell M$_3$. An intermediate voltage V$_{PPM}$ (=about 10 V) is applied to the control gate lines of the remaining memory cells. A high voltage (=about 10 V) is applied to the selection gate line SG$_1$, and a voltage of 0 V is applied to the selection gate line SG$_2$. A voltage of 0 V or the intermediate voltage V$_{PPM}$ is applied to the bit line BL$_1$ in accordance with data. A high voltage (=about 20 V) is applied to the conductive film IG. Upon application of a voltage to the conductive film IG, an inversion layer 25 is formed between the memory cells, thereby obtaining the same operation as in a device having a source-drain.

When a voltage of 0 V is applied to the bit line BL$_1$, the potential of the bit line BL$_1$ is transmitted to the selected memory cell M$_3$ to cause charge injection from the substrate side to the floating gate 15. With this operation, the threshold value of the selected memory cell M$_3$ is shifted to the positive direction. This state is defined as, e.g., "1". On the other hand, when the intermediate voltage V$_{PPM}$ is applied to the bit line BL$_1$, no charge injection to the floating gate 15 occurs. Therefore, the threshold value is kept unchanged at the negative value. This state is defined as "0".

In the data erase operation, all the control gate lines are set to 0 V. A high voltage of 20 V is applied to the bit line BL$_1$, the source line SL, the p-type well and n-type substrate having the memory cell array formed thereon. A high voltage of 10 V is applied to the selection gate lines SG$_1$ and SG$_2$. At this time, the voltage of the conductive film IG is set to 0 V. In this case, charges in the floating gate are released to the substrate side in all the memory cells, and the threshold value is shifted to the negative direction.

In the data read operation, the control gate line CG$_3$ of the selected memory cell M$_3$ is set to 0 V. The voltage of the control gate lines of the remaining memory cells, the remaining selection gate lines, and the conductive film is set to a power supply potential V$_{CC}$ (=5 V). In this state, it is detected whether or not a current flows in the selected memory cell M$_3$, thereby performing the data read operation.

The conductive film 20 is formed to cover a plurality of NAND cells. However, the NAND cells are divided into blocks each having a plurality of NAND cells, and the conductive film 20 is formed for each block.

In this case, in the data read mode, the potential of the conductive film 20 in the selected block can be set to "H" (20 volts), and the potential of the conductive film 20 in the non-selected blocks can be set to "L" (0 volts). In the data write mode, the potential of the conductive film 20 in the selected block can be set to "H" (20 volts), and the potential of the conductive film 20 in the selected block can be set to "H" (20 volts), and the potential of the conductive film 20 in the non-selected blocks can be set to "L" (20 volts).

Figure 5:
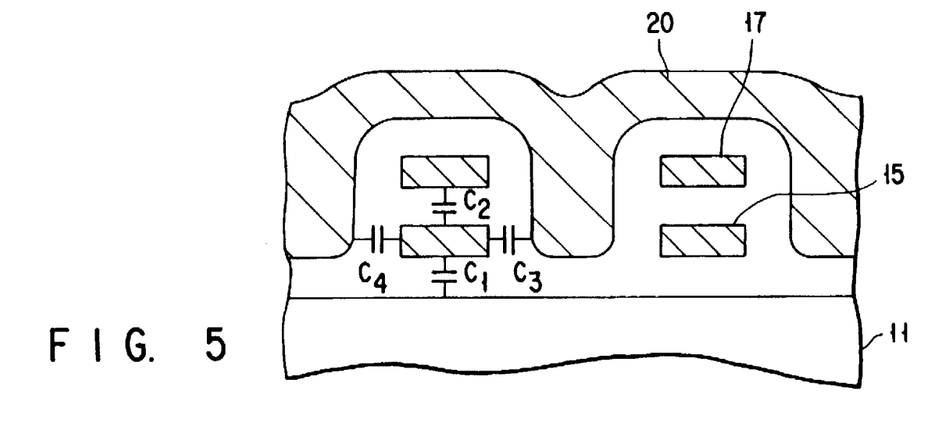
FIG. 5 is a schematic view for explaining an increasing effect of a coupling factor of the present invention.

In the above embodiment, the conductive film 20 is newly formed next to the control gate and the charge storage layer (floating gate), so that coupling capacitances are formed, as shown in FIG. 5. Assume that a capacitance between the floating gate 15 and the substrate 11 is C1, a capacitance between the floating gate 15 and the control gate 17 is C2, and a capacitance between the floating gate 15 and the conductive film 20 is C3+C4. In this case, a voltage V$_F$ applied between the floating gate 15 and the substrate upon application of the voltage (V$_{PP}$) to the control gate 17 and the conductive film 20 is represented as follows.

$$V_F = \{(C_2+C_3+C_4)/(C_1+C_2+C_3+C_4)\} \times V_{PP} \quad (1)$$

In the conventional device having no conductive film 20, a voltage V$_F$' applied between the floating gate 15 and the substrate upon application of the voltage (V$_{PP}$) to the control gate 17 is represented as follows.

$$V_F' = \{C_2/(C_1+C_2)\} \times V_{PP} \quad (2)$$

Therefore, $$V_F > V_F' \quad (3)$$

According to the embodiment of the present invention, the application of a voltage to the floating gate 15 effectively acts as compared to the conventional device. That is, the coupling factor increases.

As described above, in the first embodiment, although no source-drain diffusion layer is formed between the memory cells constituting the NAND cell, an inversion layer is formed upon application of a voltage to the conductive film 20 to connect the memory cells to each other. Therefore, the data write/read/erase operation can be performed as in the NAND cell having a source-drain diffusion layer formed between the memory cells.

According to the embodiment of the present invention, without forming a source-drain diffusion layer, a diffusion layer does not extend under the gate, thereby preventing a decrease in effective channel length. Additionally, a coupling capacitance is formed also between the conductive film 20 and the floating gate 15 so that the coupling factor of the memory cells can be increased. Therefore, the present invention can be effectively applied to reduce the size of a memory cell.

In the first embodiment, the n$^+$-type diffusion layer 13$_1$ is formed at the bit line contact portion. However, as long as a channel is effectively formed, the diffusion layer 13$_1$ is not necessarily formed.

In the first embodiment, the floating gate is used as the charge storage layer. However, the floating gate is not necessarily used. For example, an NMOS, which uses a trap layer as a charge storage layer, can also be applied. The number of NAND cells formed to be covered by the conductive film can be appropriately determined in accordance with specifications. In the above embodiment, charges are injected into the charge storage layer in the data write operation and released from the charge storage layer in the erase operation. However, these operations may be reversed, as a matter of course.

Figure 6:
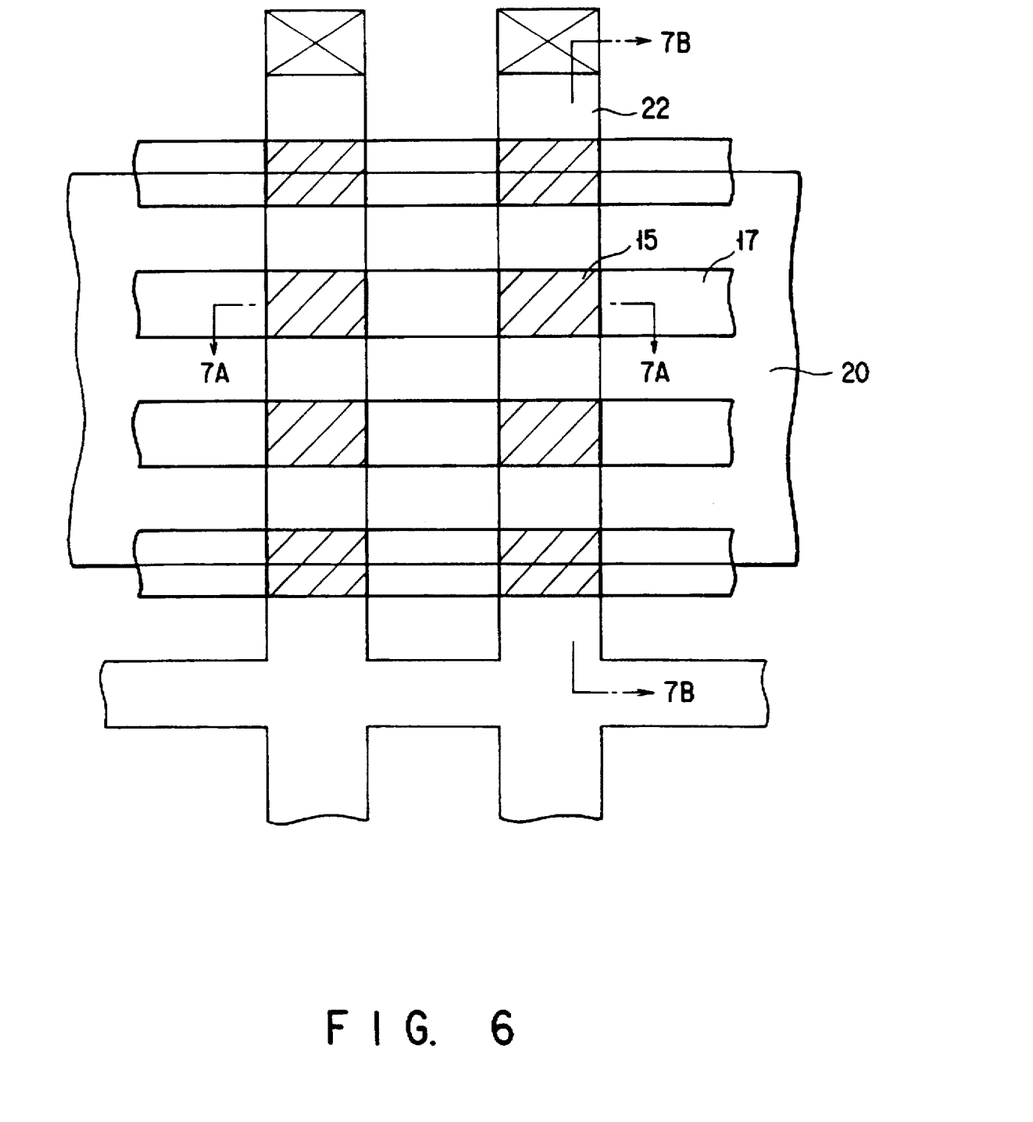
FIG. 6 is a view for explaining an improvement of the coupling factor of the memory cells according to the first embodiment of the invention.
Figure 7A:
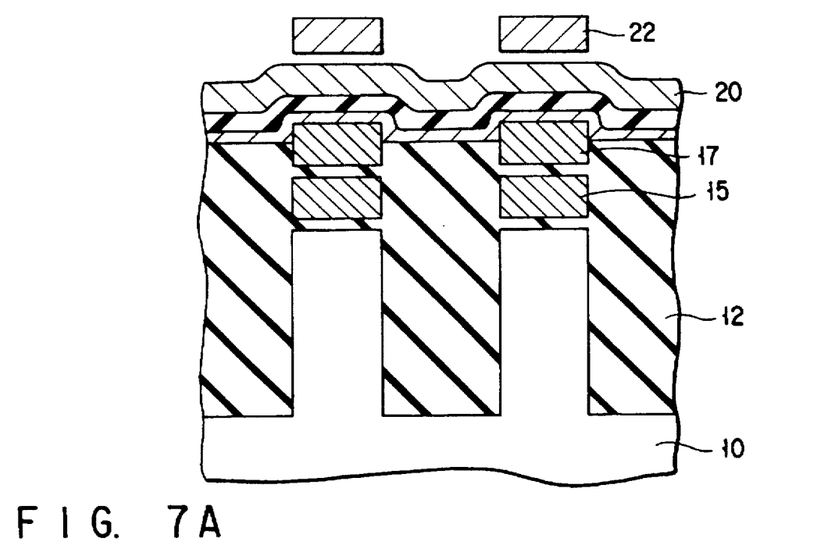
FIGS. 7A and 7B are 7A—7A and 7B—7B sectional views of FIG. 6, respectively.
Figure 7B:
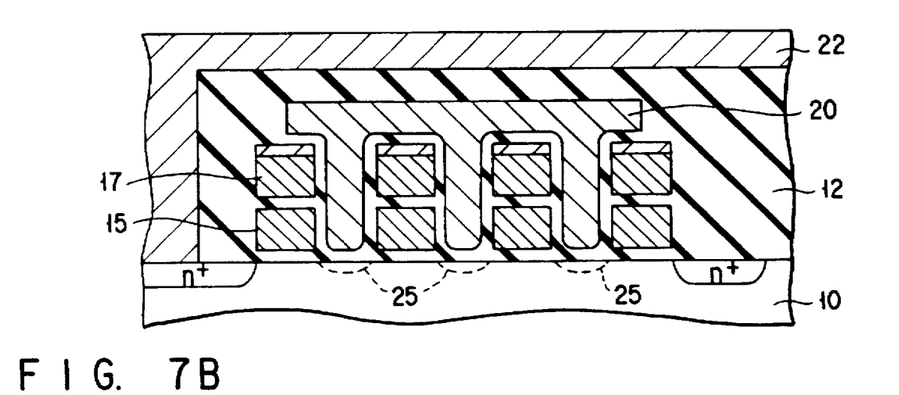

Next, in the first embodiment, improvement of a interference between adjacent floating gates and coupling factor that characterizes floating gate potential in erase/write operation according to the invention in reference to FIGS. 6, 7A and 7B.

In the conventional memory cell, in order to enlarge the coupling factor of the memory cell, it is necessary to enlarge the coupling factor. For this reason, in the conventional device, the floating gate is formed as to extend to the element isolated region.

As shown in FIG. 7A, according to the invention, since the floating gate is formed with self-alignment, no extended potion of the floating gate to the element isolated region is formed. With this configuration, since the conventional memory cell has a small coupling capacitance between the control gate and the floating gate, coupling factor of the memory cell becomes small thereby cell characteristics becomes degraded.

In the present invention, by forming a IG 20 between the floating gates 15 as shown in FIG. 7B, since the floating gate couples to not only the control gate 17 but also the IG 20, the coupling factor enlarges and the cell characteristics is improved. In addition, an interference between the floating gate 15 of each memory cell electrically screening by the IG 20.

Figure 8:
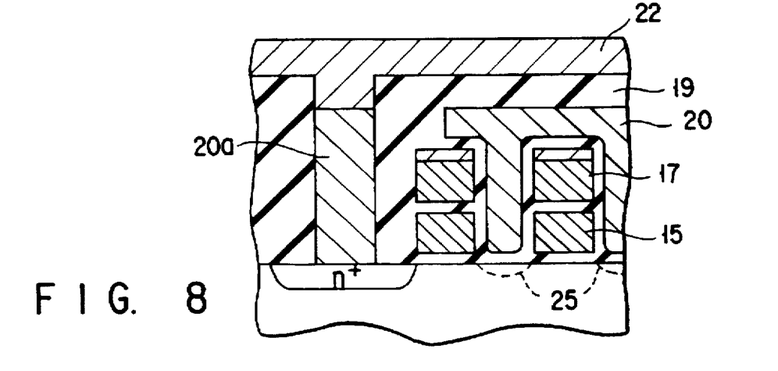
FIG. 8 shows a modification of FIG. 7B.

FIG. 8 is a view showing a modification of the FIG. 7. In FIG. 8, a bit contact is not formed by directly connecting to the bit line. The bit line contact is formed by forming, when the IG 20 is formed, the same layer as a conductive film 20a of the IG 20 as a wiring material of the bit line contact thereafter the bit line contact is formed by laying the bit line on the conductive film 20a.

In the above embodiment, the IG 20 is formed between the memory cells, a diffusion layer may be formed between the memory cells to improve the coupling factor. On the premise that the bit line is layered as shown in this modification, since no new process for forming the IG 20 is necessary, it is advantageous for simplicity of the process.

Figure 9A:
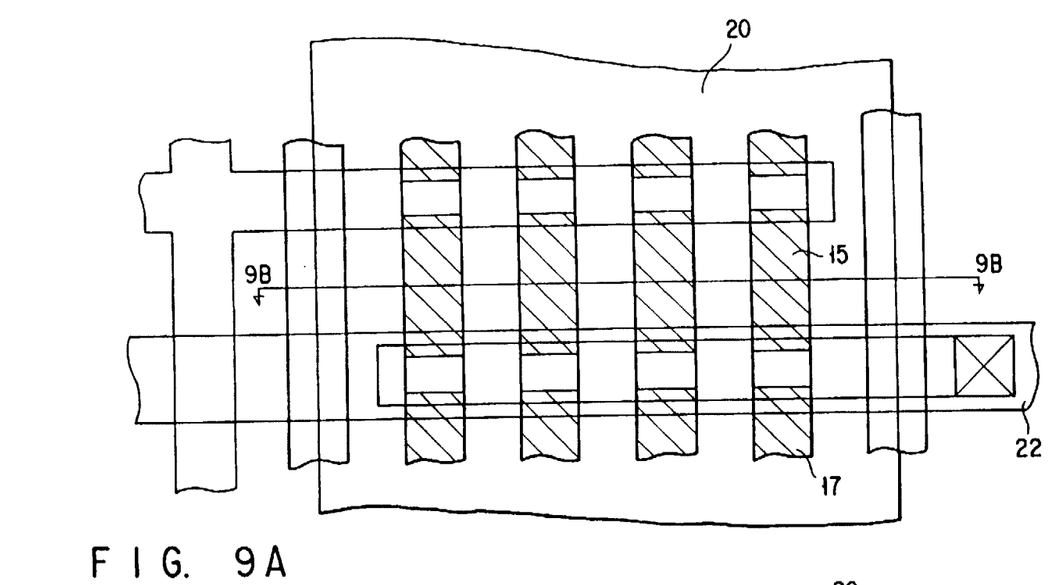
FIG. 9A is a planar view of AND-type memory cell according to a second embodiment of the invention and FIG. 9B is a 9B—9B sectional view of FIG. 9A and FIG. 9C an equivalent shows circuit of FIG. 9A.
Figure 9B:
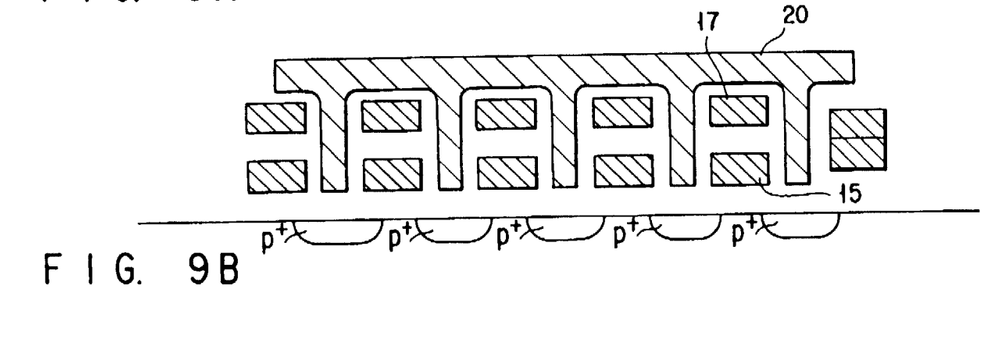
Figure 9C:
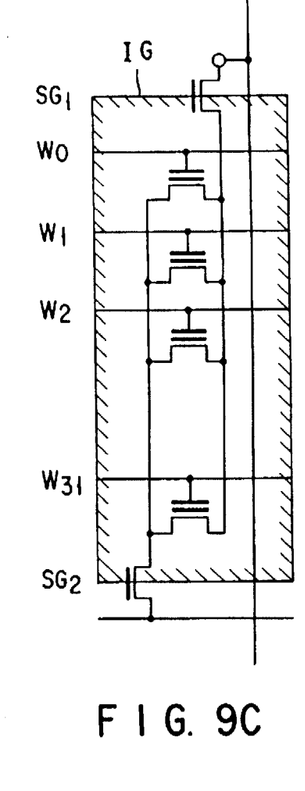

FIG. 9A is a plane view of the AND-type memory cell according to the second embodiment of the invention, FIG. 9B is a 9B—9B sectional view of the FIG. 9A, and FIG. 9C is an equivalent circuit thereof.

FIG. 9B shows an example of forming the p$^+$-diffusion layer on the substrate 10.

As shown in FIGS. 9A and 9B, IG 20 is applied to the AND-type EEPROM memory cell in addition to the NAND-type memory cell of the first embodiment. The coupling factor between the IG 20 and the floating gate 15 by coupling the IG 20 with the floating gate 15 thereby the characteristics of the memory cell is improved. Further, since the interference between the floating gate 15 of each memory cell is electrically shielded by the IG 20, the interference between memory cells is removed. FIGS. 9A and 9B show examples of forming the diffusion layer on the substrate 10, the diffusion layer may not necessary if a voltage capable of forming a inversion layer having sufficient area can be applied to the IG 20.

The third embodiment of the invention applied-to a MOS transistor will be explained.

Figure 10A:
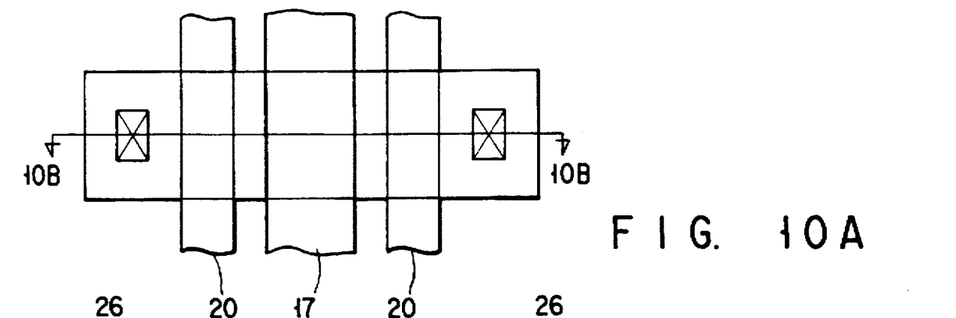
FIG. 10A is a planar view of a MOS transistor according to a third embodiment of the invention and FIG. 10B is a 10B—10B sectional view of FIG. 10A.
Figure 10B:
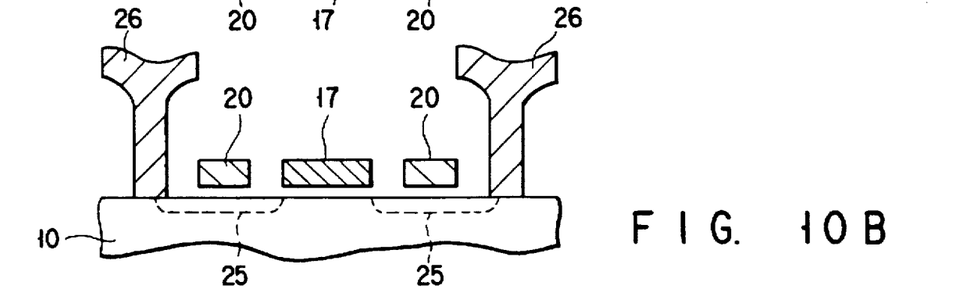

FIG. 10A is a plane view of the MOS transistor according to the third embodiment of the invention, and FIG. 10B is a 10B—10B sectional view of the FIG. 10A.

The structure of the embodiment is that the inversion layer 25 is formed on the substrate 10 by applying the voltage to the IG 20 and elements are coupled with each other same as the first embodiment.

With this structure, no source and drain diffusion layer are necessary between the electrode of the MOS transistor and the degradation of the effective channel length by soaking the diffusion layer into the lower part of the gate is prevented. Further, since no diffusion layer is necessary, minute cell structure can be attained.

Figure 11A:
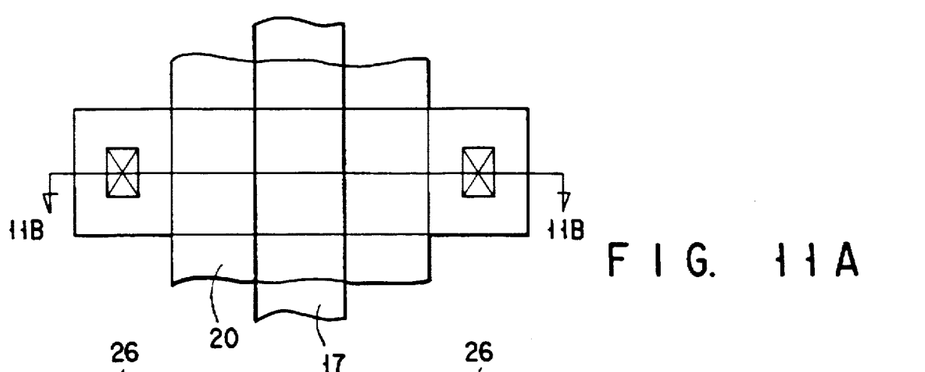
FIG. 11A is a planar view of a MOS transistor according to a first modification of the third embodiment of the invention and FIG. 11B is a 11B—11B sectional view of FIG. 11A.
Figure 11B:
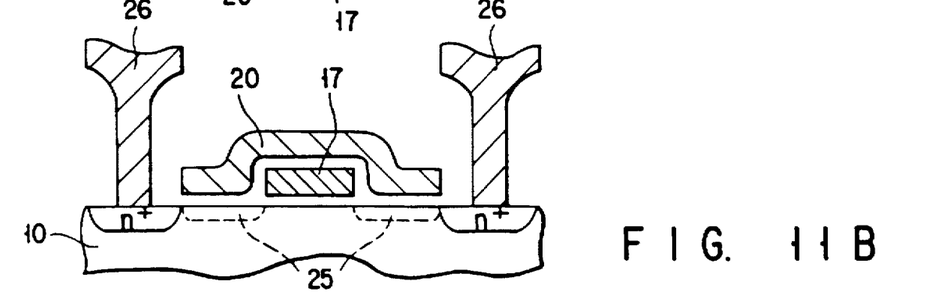

FIG. 11A is a plane view of the MOS transistor according to the third embodiment of the invention, and FIG. 11B is a 11B—11B sectional view of the FIG. 11A.

The device of the first modification has a IG 20 which is differ from the third embodiment, and forms a diffusion layer at the contact portion of the electrode 20 and the substrate 10.

The device of the first modification forms the inversion layer 25 at the surface of the substrate by applying the voltage to the IG 20 to connect between the elements.

With this configuration, no forming the source-drain diffusion layer between the electrodes of MOS transistors is necessary same as the third embodiment, and the degradation of the effective channel length by soaking the diffusion layer into the lower part of the gate can be prevented. Further, since a diffusion layer is formed at the contact portion of the electrode 26 and substrate 10 by the first modification which is different from the third embodiment, a large inversion layer 25 shown as the third embodiment is not necessary to turn on or turn off the MOS transistors so as to the lower voltage applied to the IG 20 than that of the third embodiment can be set.

Figure 12A:
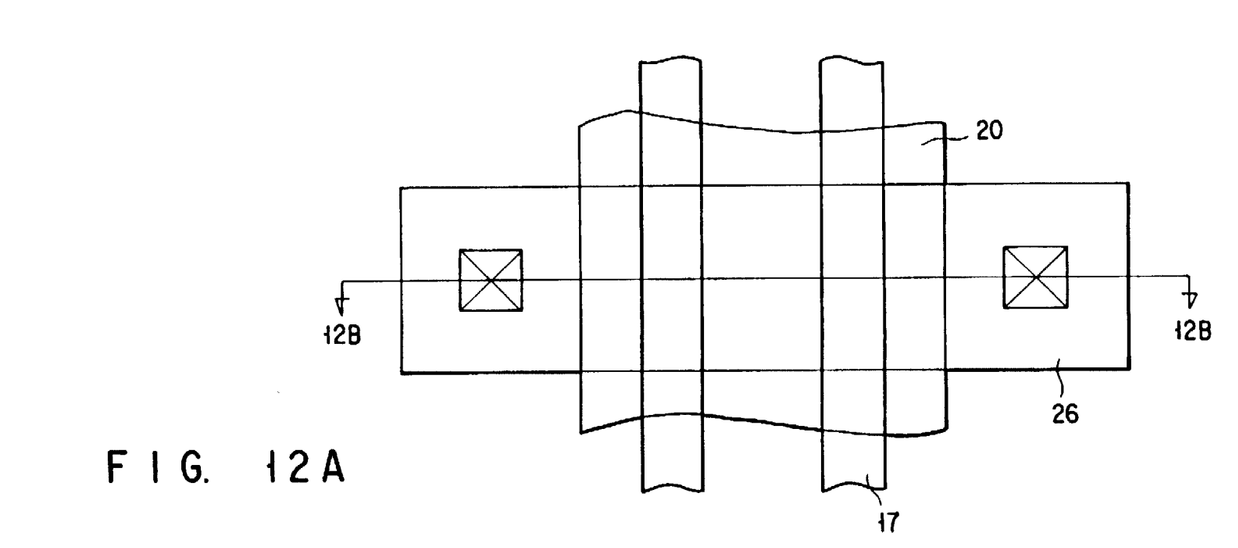
FIG. 12A is a planar view of a MOS transistor according to a second modification of the third embodiment of the invention and FIG. 12B is a 12B—12B sectional view of FIG. 12A.
Figure 12B:
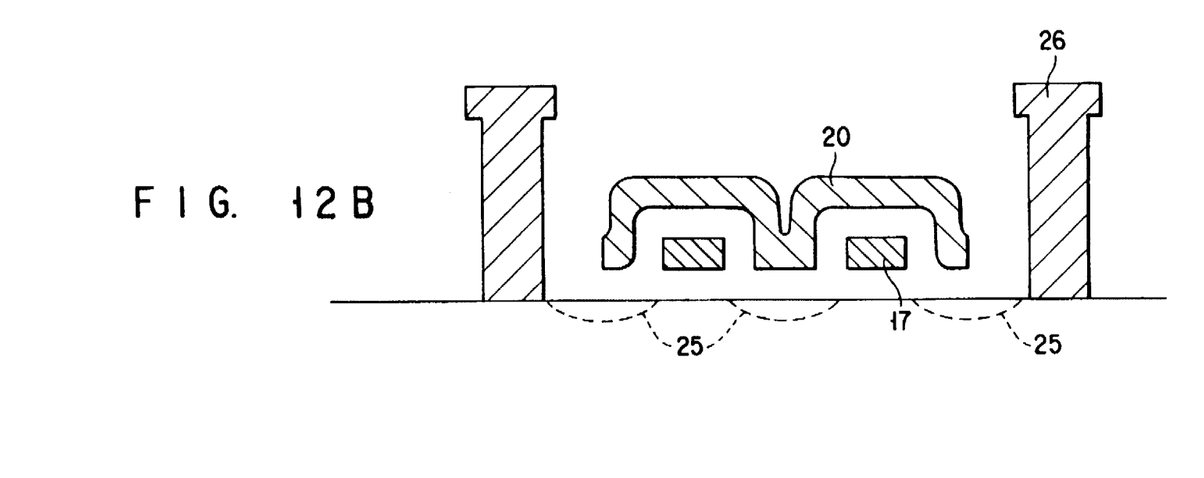

FIG. 12A is a plane view of the MOS transistor according to the third embodiment of the invention, and FIG. 12B is a 12B—12B sectional view of the FIG. 12A.

The second modification shows an example of two control gates 17 in the first modification.

In the second modification, the inversion layer 25 is formed at the surface of the substrate by applying the voltage to the IG 20 to connect between the elements.

With this configuration, no forming the source-drain diffusion layer between the electrodes of MOS transistors is necessary same as the third embodiment, and the degradation of the effective channel length by soaking the diffusion layer into the lower part of the gate can be prevented. Further, since a diffusion layer is formed at the contact portion of the electrode 26 and substrate 10 by the first modification which is different from the third embodiment, a large inversion layer 25 shown as the third embodiment is not necessary to turn on or turn off the MOS transistors so as to the lower voltage applied to the IG 20 than that of the third embodiment can be set. In the second modification, the diffusion layer of the contact portion of the electrode 26 and the substrate 10 can be omitted same as the third embodiment.

FIGS. 13A to 13E show embodiments applied to the dynamic semiconductor memory device (DRAM).

Figure 13A:
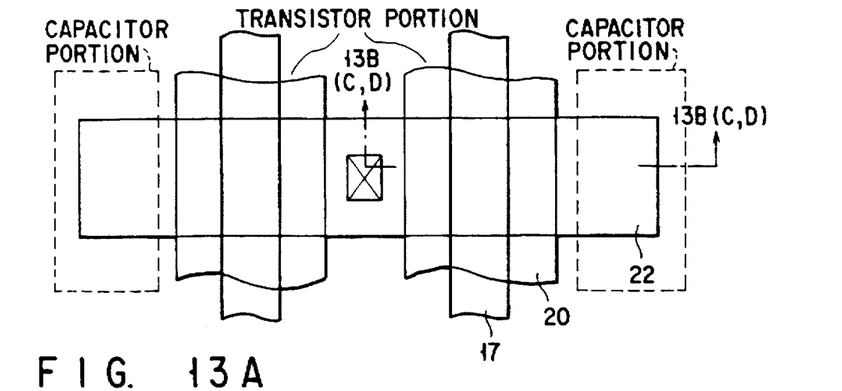
FIG. 13A is a planar view of a MOS transistor according to a fourth embodiment of the invention and FIGS. 13B to 13D are 10B—10B sectional views of FIG. 13A, and FIGS. 13B to 13D show a planar type, a stack type and a trench type, respectively.
Figure 13B:
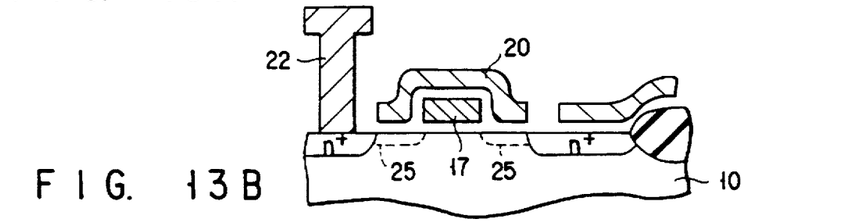
Figure 13C:
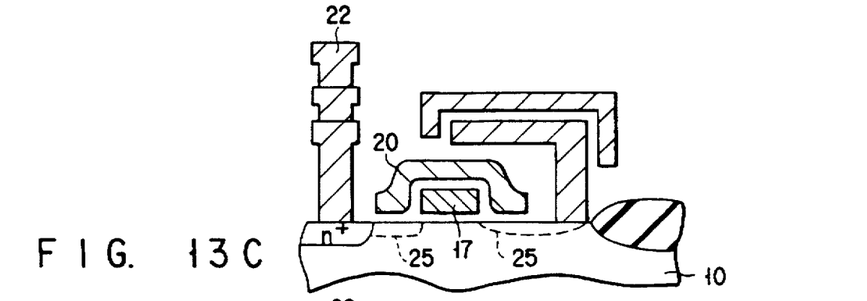
Figures 13D, 13E:
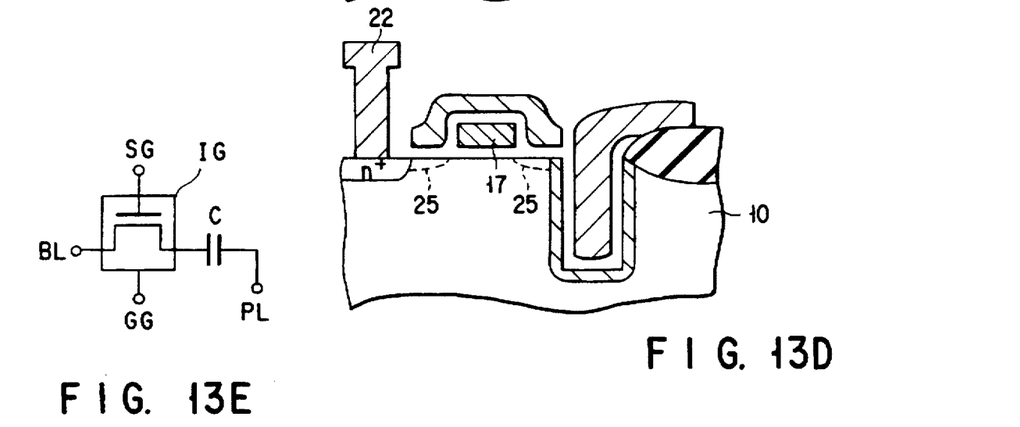
FIG. 13E shows an equivalent circuit diagram of FIG. 13A.

FIG. 13A is a plane view of the DRAM which includes capacitor portions and transistor portions. FIGS. 13B to 13D is a 13B(C,D)—13B(C,D) sectional view of the FIG. 13A. FIG. 13B shows a planar type, FIG. 13C shows a stack type and FIG. 13D shows a trench type. FIG. 13E shows a circuit diagram showing an equivalent circuit of an element structure in FIG. 13A.

As shown in FIGS. 13A to 13D, the IGs 20 are formed on upper potion and side portion of the control gate 17 and the inversion layer is formed by applying a predetermined voltage to the IG 20 same as the first to third embodiments.

Accordingly, in relating to a lowering of the effective channel length, the same advantages as the first to third embodiments are obtained by applying to the DRAM.

The present invention is not limited to the above-described embodiment, and various changes and modifications can be made within the spirit and scope of the present invention.

Additional advantages and modifications will readily occur to those skilled in the art. Therefore, the present invention in its broader aspects is not limited to the specific details, representative devices, and illustrated examples shown and described herein. Accordingly, various modifications may be made without departing from the spirit or scope of the general inventive concept as defined by the appended claims and their equivalents.

What is claimed is:

1. A semiconductor device comprising:

a semiconductor substrate;

a first insulating film formed on said semiconductor substrate;

a plurality of electrically erasable semiconductor memory cells each having a control gate formed above said semiconductor substrate through said first insulating film and a charge storage layer formed between said first insulating film and said control gate so that an electrical rewrite operation can be performed by changing an amount of charges of the charge storage layer;

a second insulating film formed on upper surface of said control gate and side surfaces of said control gate and said charge storage layer; and a conductive film formed on at least the side surface of said control gate and said charge storage layer through said second insulating film.

wherein said conductive film commonly covers all spaces between adjacent word lines in a memory block.

2. A device according to claim 1, further comprising voltage supplying circuit connected to said conductive film formed on the side surface of the control gate via the second insulating film, wherein, when the voltage is applied from said voltage supplying circuit to said conductive film, an inversion layer is formed on a surface region of said substrate faced to said conductive film.

3. A semiconductor device according to claim 1, wherein said memory cells constitutes at least two memory blocks, and a same voltage is applied to said conductive film provided in an area corresponding to each of said memory blocks.

4. A semiconductor device according to claim 1, wherein a selected number of said memory cells constitute an unit which are connected in series.

5. A semiconductor device according to claim 1, wherein more than one of said memory cells are connected in parallel to constitute one unit memory cell.

6. A semiconductor device according to claim 1, wherein, said memory cells are divided into a plurality of blocks and said conductive films are formed for each block, and further comprises means, in one of a data read mode, a data write mode and a data erase mode, for applying a second voltage to the conductive film in a selected block including a selected word line, when a first voltage is applied to the selected word line, and for applying a third voltage to the conductive film in a non-selected block.

7. A device according to claim 4, wherein in a data read mode, a potential of a selection gate and a drain of a NAND cell comprising said unit is set to a power supply potential, a potential of a word line selected from word lines comprising said control gates is set to "L", a potential of non-selected word lines is set to the power supply potential, a potential of a source of said NAND cell is set to "L", and a potential of said substrate is set to "L", thereby setting a potential of said conductive film to the power supply potential, in a data erase mode, the potential of said selection gate and said drain of said NAND cell is set to "H", the potential of all of said work lines in said NAND cell is set to "L", and the potential of said substrate is set to "H", thereby setting the potential of said conductive film to "L", or in a data write mode, the potential of said drain of said NAND cell is set to "L" or "M", the potential of said selected word line is set to "H", the potential of a drain-side selection gate and said non-selected word lines is set to "M", and the potential of a source-side selection gate and said substrate is set to "L", thereby setting the potential of said conductive film to "H".

8. A device according to claim 7, wherein said memory cells are divided into blocks each having a plurality of NAND cells, and said conductive film is formed for said each block, in the data read mode, the potential of said conductive film in a selected block is set to the power supply potential, the potential of said conductive film in non-selected blocks is set to "L", in the data write mode, the potential of said conductive film in said selected block is set to "H", and the potential of said conductive film in said non-selected blocks is set to "L".

9. A semiconductor device comprising:

a semiconductor substrate;

a first insulating film formed on said semiconductor substrate;

a plurality of electrically erasable semiconductor memory cells each having a control gate formed above said semiconductor substrate through said first insulating film and a charge storage layer formed between said first insulating film and said control gate so that an electrical rewrite operation can be performed by changing an amount of charges of the charge storage layer;

a second insulating film formed on upper surface of said control gate and side surfaces of said control gate and said charge storage layer; and a conductive film formed on at least the side surface of said control gate and said charge storage layer through said second insulating film.

wherein said conductive film covers all of an active area constituting each of said memory cells.

10. A semiconductor device according to claim 9, further comprising voltage supplying circuit connected to said conductive film formed on the side surface of the control gate via the second insulating film, wherein, when the voltage is applied from said voltage supplying circuit to said conductive film, an inversion layer is formed on a surface region of said substrate faced to said conductive film.

11. A semiconductor device according to claim 9, wherein said memory cells constitutes at least two memory blocks, and a same voltage is applied to said conductive film provided in an area corresponding to each of said memory blocks.

12. A semiconductor device according to claim 9, wherein a selected number of said memory cells constitute an unit which are connected in series.

13. A semiconductor device according to claim 9, wherein more than one of said memory cells are connected in parallel to constitute one unit memory cell.

14. A semiconductor device according to claim 9, wherein, said memory cells are divided into a plurality of blocks and said conductive films are formed for each block, and further comprises means, in one of a data read mode, a data write mode and a data erase mode, for applying a second voltage to the conductive film in a selected block including a selected word line, when a first voltage is applied to the selected word line, and for applying a third voltage to the conductive film in a non-selected block.

15. A device according to claim 12, wherein in a data read mode, a potential of a selection gate and a drain of a NAND cell comprising said unit is set to a power supply potential, a potential of a word line selected from word lines comprising said control gates is set to "L", a potential of non-selected word lines is set to the power supply potential, a potential of a source of said NAND cell is set to "L", and a potential of said substrate is set to "L", thereby setting a potential of said conductive film to the power supply potential, in a data erase mode, the potential of said selection gate and said drain of said NAND cell is set to "H", the potential of all of said word lines in said NAND cell is set to "L", and the potential of said substrate is set to "H", thereby setting the potential of said conductive film to "L", or in a data write mode, the potential of said drain of said NAND cell is set to "L" or "M", the potential of said selected word line is set to "H", the potential of a drain-side selection gate and said non-selected word lines is set to "M", and the potential of a source-side selection gate and said substrate is set to "L", thereby setting the potential of said conductive film to "H".

16. A device according to claim 15, wherein said memory cells are divided into blocks each having a plurality of NAND cells, and said conductive film is formed for said each block, in the data read mode, the potential of said conductive film in a selected block is set to the power supply potential, the potential of said conductive film in non-selected blocks is set to "L", in the data write mode, the potential of said conductive film in said selected block is set to "H", and the potential of said conductive film in said non-selected blocks is set to "L".

17. A semiconductor device comprising:

a semiconductor substrate, a first insulating film formed on said semiconductor substrate;

a plurality of electrically erasable semiconductor memory cells each having a source, a drain, a control gate formed above said semiconductor substrate through said first insulating film, and a charge storage layer formed between said first insulating film and said control gate so that an electrical rewrite operation can be performed by changing an amount of charges of the charge storage layer;

a second insulating film formed on upper surface of said gate and said side surfaces of said control gate and said charge storage layer; and a conductive film formed on at least the side surface of said control gate and said charge storage layer through said second insulating film, wherein said conductive film is symmetrically formed at both sides of said control gate in each basic memory cell, in which said control gate is an axis of symmetry, and said conductive film formed at both sides are electrically connected.

18. A semiconductor device according to claim 17, further comprising voltage supplying circuit connected to said conductive film formed on the side surface of the control gate via the second insulating film, wherein, when the voltage is applied from said voltage supplying circuit to said conductive film, an inversion layer is formed on a surface region of said substrate faced to said conductive film.

19. A semiconductor device according to claim 17, wherein said memory cells constitutes at least two memory blocks, and a same voltage is applied to said conductive film provided in an area corresponding to each of said memory blocks.

20. A semiconductor device according to claim 17, wherein a selected number of said memory cells constitute an unit which are connected in series.

21. A semiconductor device according to claim 17, wherein more than one of said memory cells are connected in parallel to constitute one unit memory cell.

22. A semiconductor device according to claim 17, wherein, said memory cells are divided into a plurality of blocks and said conductive films are formed for each block, and further comprises means, in one of a data read mode, a data write mode and a data erase mode, for applying a second voltage to the conductive film in a selected block including a selected word line, when a first voltage is applied to the selected word line, and for applying a third voltage to the conductive film in a non-selected block.

23. A device according to claim 20, wherein in a data read mode, a potential of a selection gate and a drain of a NAND cell comprising said unit is set to a power supply potential, a potential of a word line selected from word lines comprising said control gates is set to "L", a potential of non-selected word lines is set to the power supply potential, a potential of a source of said NAND cell is set to "L", and a potential of said substrate is set to "L", thereby setting a potential of said conductive film to the power supply potential, in a data gate erase mode, the potential of said selection gate and said drain of said NAND cell is set to "H", the potential of all of said word lines in said NAND cell is set to "L", and the potential of said substrate is set to "H", thereby setting the potential of said conductive film to "L", or in a data write mode, the potential of said drain of said NAND cell is set to "L" or "M", the potential of said selected word line is set to "H", the potential of a drain-side selection gate and said non-selected word lines is set to "M", and the potential of a source-side selection gate and said substrate is set to "L", thereby setting the potential of said conductive film to "H".

24. A device according to claim 23, wherein said memory cells are divided into blocks each having a plurality of NAND cells, and said conductive film is formed for said each block, in the data read mode, the potential of said conductive film in a selected block is set to the power supply potential, the potential of said conductive film in non-selected blocks is set to "L", in the data write mode, the potential of said conductive film in said selected block is set to "H", and the potential of said conductive film in said non-selected blocks is set to "L".

25. A device according to claim 17, wherein said basic memory cell is symmetrically formed, in which said control gate is set as a symmetrical axis.

* * * * *